US009819120B2

(12) United States Patent
Mukuno et al.

(10) Patent No.: US 9,819,120 B2
(45) Date of Patent: Nov. 14, 2017

(54) CONNECTOR

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Junichi Mukuno, Mie (JP); Katsuhiko Aizawa, Mie (JP); Kenichi Kitaoka, Mie (JP); Shuzo Yukawa, Mie (JP)

(73) Assignees: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/515,292

(22) PCT Filed: Sep. 17, 2015

(86) PCT No.: PCT/JP2015/076405
§ 371 (c)(1),
(2) Date: Mar. 29, 2017

(87) PCT Pub. No.: WO2016/056369
PCT Pub. Date: Apr. 14, 2016

(65) Prior Publication Data
US 2017/0229808 A1    Aug. 10, 2017

(30) Foreign Application Priority Data
Oct. 8, 2014   (JP) .................................. 2014-207124

(51) Int. Cl.
| | | |
|---|---|---|
| H01R 13/58 | (2006.01) | |
| H03H 11/08 | (2006.01) | |
| H01R 13/633 | (2006.01) | |

(52) U.S. Cl.
CPC ......... *H01R 13/5845* (2013.01); *H01R 13/58* (2013.01); *H01R 13/633* (2013.01); *H03H 11/08* (2013.01)

(58) Field of Classification Search
CPC .................................................. H01R 13/5845
See application file for complete search history.

(56) References Cited

U.S. PATENT DOCUMENTS 5,217,388 A * 6/1993 Brown .................... H01R 4/184
439/455
2005/0230148 A1* 10/2005 Sinnett ................ B60C 23/0452
174/267

(Continued)

FOREIGN PATENT DOCUMENTS

JP       2011-9108      1/2011
JP       2014-11134     1/2014

(Continued)

OTHER PUBLICATIONS

International Search Report dated Dec. 8, 2015.

*Primary Examiner* — James Harvey
(74) *Attorney, Agent, or Firm* — Gerald E. Hespos; Michael J. Porco; Matthew T. Hespos

(57) ABSTRACT

A connector C to be mounted on a case of a device includes a coated wire 10 formed such that a core 11 is coated with an insulation coating 12, a terminal fitting 20 to be fit and connected to a mating terminal, a flexible conductor 15 interposed between the terminal fitting 20 and an end of the coated wire 10, and a housing 30 made of synthetic resin and accommodating the terminal fitting 20 together with the flexible conductor 15. The core 11 of the coated wire 10 is (Continued)

provided with a core fixing portion 25 integrated with the core 11 and the core fixing portion 25 is embedded in the housing 30 by molding.

9 Claims, 2 Drawing Sheets

(56) References Cited

U.S. PATENT DOCUMENTS

| | | | |
|---|---|---|---|
| 2005/0231343 A1* | 10/2005 | Sinnett | H01Q 1/2241 |
| | | | 340/442 |
| 2009/0186506 A1* | 7/2009 | Chen | H01R 13/5845 |
| | | | 439/281 |
| 2013/0023158 A1* | 1/2013 | Kato | H01R 43/24 |
| | | | 439/625 |
| 2013/0140056 A1* | 6/2013 | Adachi | H01R 13/5205 |
| | | | 174/120 SR |
| 2013/0316573 A1* | 11/2013 | Uno | H01R 11/12 |
| | | | 439/573 |
| 2014/0051286 A1 | 2/2014 | Itsuki et al. | |
| 2014/0120763 A1 | 5/2014 | Itsuki et al. | |
| 2014/0148034 A1* | 5/2014 | Kashiwada | H01R 13/512 |
| | | | 439/345 |
| 2017/0012370 A1* | 1/2017 | Hamaguchi | C09J 123/26 |

FOREIGN PATENT DOCUMENTS

| | | |
|---|---|---|
| JP | 2014-38793 | 2/2014 |
| JP | 2014-86349 | 5/2014 |

* cited by examiner

CONNECTOR

BACKGROUND

1. Field of the Invention

This specification relates to a connector.

2. Description of the Related Art

Japanese Unexamined Patent Publication No. 2014-11134 discloses a connector with a function of blocking vibration from a wire. This connector is structured such that a terminal fitting to be fit and connected to a mating terminal is accommodated into a cavity provided in a front end side of a housing and an elastic conductor formed of a braided wire is connected to a rear end of the terminal fitting. A coated wire is introduced into the housing through a bottom wall of the housing and an end thereof is connected to the elastic conductor.

An end of a core in the coated wire and a rear end of the elastic conductor are welded by resistance welding to form a welded portion in the form of a flat plate, and this welded portion is bolted to be fixed to the housing. With this structure, vibration that might otherwise be transmitted from the coated wire (core) to the terminal fitting is blocked in a part where the welded portion is fixed to the housing to prevent a contact failure between terminal fittings.

However, in the above vibration blocking measure, it is necessary to form each of the end of the core and the rear end of the elastic conductor into a flat plate shape, weld both and form a screw hole. Further, to fix the welded portion to the housing, the welded portion needs to be fastened with a separately provided bolt. Thus, it generally takes time and effort for manufacturing and cost tends to be high.

The present invention was completed based on the above situation and aims to provide a vibration blocking structure capable of blocking vibration at low cost.

SUMMARY

This specification is directed to a connector with a coated wire that has a conductive core coated with an insulation coating, a terminal fitting to be fit and connected to a mating terminal, a flexible conductor interposed between the terminal fitting and an end of the coated wire, and a housing made of synthetic resin and accommodating the terminal fitting together with the flexible conductor. The core of the coated wire is provided with a core fixing portion integrated with the core and the core fixing portion is embedded in the housing by molding.

Vibration that would otherwise be transmitted from the core of the coated wire to the terminal fitting is blocked in a part where the core fixing portion integrated with the core is fixed to the housing and, hence, a contact failure between terminal fittings can be prevented. The part functioning to block the vibration is formed by embedding the core fixing portion provided on the core in the housing by molding, which can simplify a manufacturing process and contribute to a cost reduction.

The core fixing portion may be a metal member fixed to the core.

The core may have a plurality of strands, and the core fixing portion may be formed by bonding the strands by resistance welding or ultrasonic welding.

No metal member is used in forming the core fixing portion. Thus, these configurations can contribute to a reduction in the number of components.

The housing is provided with a wire insertion hole into which an end part of the coated wire is to be inserted. The core fixing portion is provided on the core exposed by removing the insulation coating at an intermediate position in a length direction of the end part of the coated wire, and is embedded in an inner surface of the wire insertion hole.

The core fixing portion may be provided on the core exposed at the end part of the coated wire is fixed to the housing by being embedded in the inner surface of the wire insertion hole.

The flexible conductor may be bent to provide an extra length of the core pulled out in an exposed state from the end of the coated wire.

The flexible conductor functions to absorb an assembling tolerance of housings and the like. Since this flexible conductor is formed utilizing the core pulled out from the end of the coated wire, a structure can be simplified.

The coated wire may be pulled out in a direction intersecting with a fitting direction of the terminal fitting.

The connector is formed into an L shape, which can contribute to space saving in the fitting direction.

According to the technique disclosed by this specification, it is possible to provide a vibration blocking structure capable of blocking vibration at low cost.

DETAILED DESCRIPTION

Figure 1:
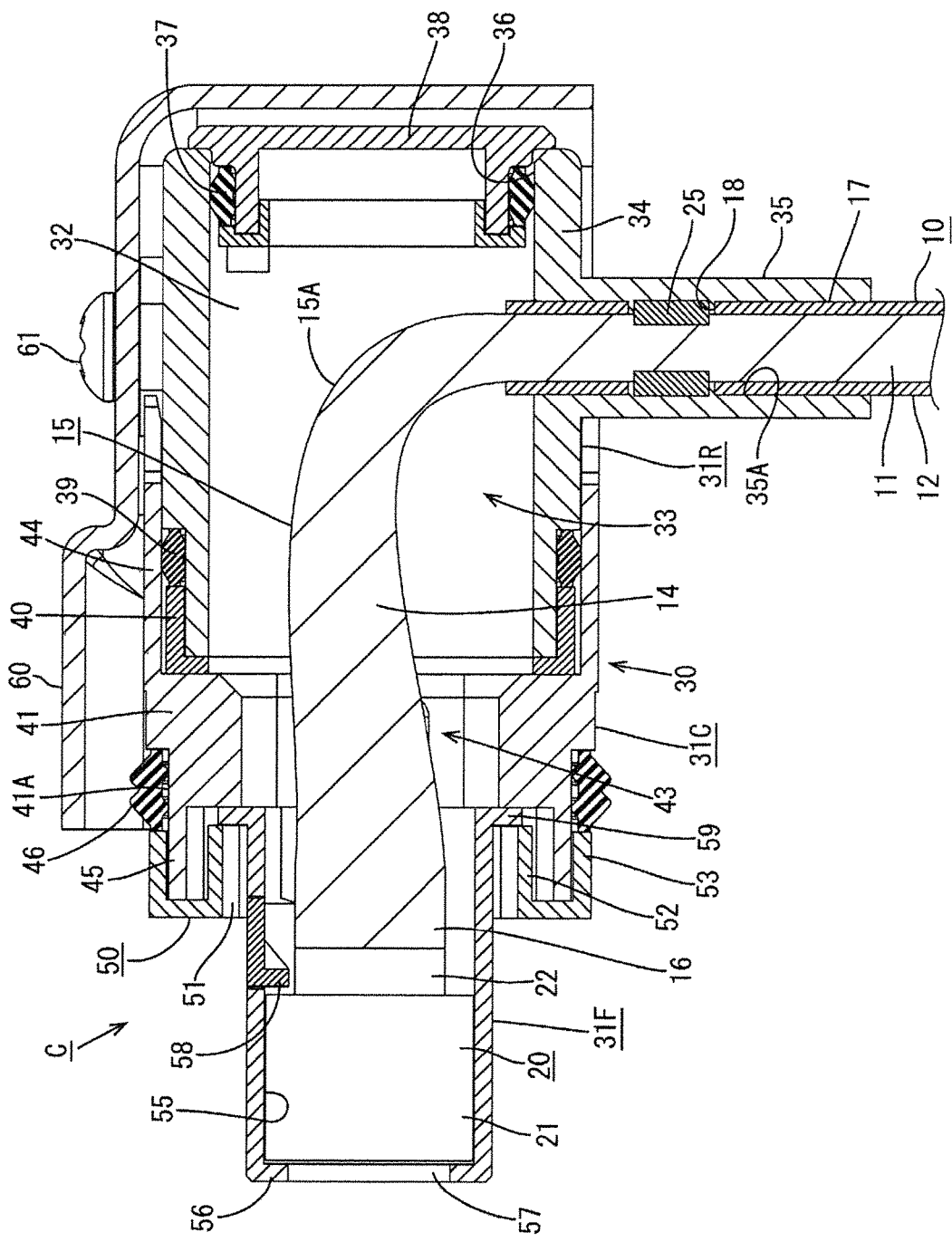
FIG. 1 is a longitudinal section of a connector according to a first embodiment.

A first embodiment is described on the basis of FIG. 1. A connector C of this embodiment is used by being mounted on a case of a device (e.g. an inverter, a motor or the like installed in a hybrid vehicle or an electric vehicle).

The connector C roughly includes a plurality of terminal fittings 20 individually provided on ends of coated wires 10, a housing 30 made of synthetic resin and configured to accommodate the terminal fittings 20, and a shield shell 60 to be mounted to cover the housing 30.

The terminal fitting 20 is a female terminal and functions to be fit and connected to an unillustrated mating terminal (male terminal) mounted in a mating connector provided in the case. The terminal fitting 20 includes a terminal body 21 in the form of a rectangular tube having a resilient contact piece inside and a mounting plate 22 formed to extend from the rear edge of the terminal body 21.

The coated wire 10 is structured such that an outer periphery of a core 11 made of a twisted wire formed by twisting a plurality of metal strands 11A (see FIG. 2) with an insulation coating 12. The insulation coating 12 is removed (stripped) by a predetermined length on the end of the coated wire 10, whereby the long exposed core 11 (hereinafter, long strip 14) is pulled out and this long strip 14 is bent into a substantially L shape to provide an extra length, thereby forming a flexible conductor 15. A tip part of the long strip 14 is flatly expanded and this flat portion 16 is fixed to the mounting plate 22 on the rear end of the terminal fitting 20 described above by resistance welding.

The housing 30 is made of synthetic resin as described above and composed of three pieces including a rear housing 31R, a central housing 31C and a front housing 31F.

The rear housing 31R has a rectangular tube shape with open front and rear surfaces and the interior thereof is partitioned into as many accommodation chambers 33 as the terminal fittings 20 in the lateral direction in a front view by partition walls 32. A wire insertion tube 35 is formed to project downward at a position of a bottom wall 34 of each accommodation chamber 33 somewhat near a rear end. A part (inserting portion 17) having a predetermined length of an end part of the coated wire 10 with the remaining insulation coating 12 is inserted into this wire insertion tube 35 as described in detail later.

A rear part of the flexible conductor 15 formed with a bent portion 15A is accommodated in each accommodation chamber 33 of the rear housing 31R. A rear lid body 38 having a first seal ring 37 fit on an outer periphery is fit into a rear surface opening 36 of the rear housing 31R over the entire periphery.

A second seal ring 39 is fit on the outer periphery of a front end side of the rear housing 31R and prevented from coming off by a seal presser 40.

The central housing 31C includes a short and thick rectangular tube portion 41 and the interior thereof is similarly partitioned into as many accommodation chambers 43. A thin mounting tube portion 44 to be tightly fit to the outer periphery of a front end part of the rear housing 31R described above is formed to project from the outer peripheral edge of the rear end surface of the rectangular tube portion 41.

The outer periphery is reduced in diameter on a front end side of the rectangular tube portion 41, and a thin supporting tube portion 45 is formed to project from the outer peripheral edge of the front end surface of that reduced diameter portion 41A. A third seal ring 46 is fit on the outer periphery of the reduced diameter portion 41A, a front holder 50 having a channel shaped cross-section is fit to the supporting tube portion 45 and functions to prevent the come-off of the third seal ring 46 and the like.

The front housing 31F is formed into a substantially rectangular tube shape fittable with a predetermined clearance formed between the front housing 31F and the inner periphery of the front holder 50 and the interior thereof is formed with cavities 55 for accommodating the respective terminal fittings 20 tightly inserted thereinto. A terminal insertion opening 57 into which a tab of the mating terminal (male terminal) is to be inserted is formed in a front wall 56 of the cavity 55.

A retainer 58 for locking and retaining the rear edges of the terminal bodies 21 of the terminal fittings 20 is mounted on the upper surface of the front housing 31F movably back and forth in a direction perpendicular to an inserting direction of the terminal fittings 20.

A flange 59 having an outer diameter larger than an inner diameter of an inner peripheral wall 52 of the front holder 50 is formed to protrude on the rear end edge of the front housing 31F. The front housing 31F is retained by being sandwiched between the front surface of the rectangular tube portion 41 of the central housing 31C and the rear end surface of the inner peripheral wall 52 of the front holder 50 mounted on the central housing 31C, and loosely movable in a radial direction by the presence of the clearance 51 described above, i.e. supported in a floating manner.

In this embodiment, the core 11 is exposed by removing the insulation coating 12 by the predetermined length at an intermediate position in a length direction of the inserting portion 17 in the coated wire 10, a relatively short metal sleeve 25 (an example of a "core fixing portion") is fixed to the outer periphery of the exposed core 11, and that metal sleeve 25 is embedded in an inner peripheral surface 35A of the wire insertion tube 35 provided in the rear housing 31R.

Next, an example of an assembling procedure of the connector C of this embodiment including a step of embedding the metal sleeve 25 described above is described anew.

The coated wire 10 is formed such that the long exposed core 11, i.e. the long strip 14 exposed by removing the insulation coating 12 on the end thereof over the predetermined length is pulled out. Further, the metal sleeve 25 is freely slidably fit on the outer periphery of the coated wire 10. Thus, an initial shape of the metal sleeve 25 is a circular ring shape having an inner diameter slightly larger than an outer diameter of the coated wire 10.

In the end part of the coated wire 10 with the remaining insulation coating 12, i.e. the inserting portion 17, the insulation coating 12 is removed in an area slightly longer than the above metal sleeve 25 at the intermediate position in the length direction (removed portion 18) to expose the core 11. Thereafter, the metal sleeve 25 allowed to escape is slid to the removed portion 18 and fit to the outer periphery of the exposed core 11. Then, the metal sleeve 25 is crimped by a tool or the like to be fixed to the core 11. Examples of crimping include squeezing into a flat shape and hexagonal crimping.

On the other hand, the tip part of the long strip 14 pulled out at the end of the coated wire 10 is flatly expanded and this flat portion 16 is fixed to the mounting plate 22 on the rear end of the terminal fitting 20 by resistance welding.

As just described, a plurality of the coated wires 10 having the terminal fittings 20 individually connected on the tip parts of the long strips 14 are set in an unillustrated mold with the flexible conductors 15 formed by bending the long strips 14 at a right angle at intermediate positions, and the rear housing 31R is formed by molding. When the rear housing 31R is formed, rear sides of the flexible conductors 15 of the respective coated wires 10 are accommodated in the accommodation chambers 33 and the terminal fittings 20 project forward of the rear housing 31R.

On the other hand, the inserting portions 17 of the coated wires 10 are pulled downwardly through the wire insertion tubes 35. Here, the metal sleeves 25 directly fixed to the cores 11 exposed in the inserting portions 17 are embedded in the inner peripheral surfaces 35A of the wire insertion tubes 35.

Note that the plurality of pulled-out coated wires 10 are put together into a harness.

In a front end side of the rear housing 31R formed by molding as described above, the second seal ring 39 is prevented from coming off by the seal pressor 40 after being fit. Subsequently, the central housing 31C having the third seal ring 46 fit thereon is brought into contact with the front surface side of the rear housing 31 with the terminal fittings 20 passed through the accommodation chambers 43, and the mounting tube portion 44 on the rear end is locked and coupled to the outer periphery of a front end part of the rear housing 31R.

Along with that, the front housing 31F with the retainer 58 held at a retracted position is prepared and moved toward the front surface of the central housing 31C while the flexible conductors 15 are pressed through the rear surface opening 36 of the rear housing 31R, whereby the respective terminal fittings 20 are inserted into the corresponding cavities 55 from behind. When the terminal fittings 20 are inserted until coming into contact with the front walls 56, the retainer 58 is pushed to an advanced position and the respective terminal fittings 20 are retained and accommodated in the cavities 55.

Subsequently, the front holder 50 is fit from front while the front housing 31F is passed inside the inner peripheral wall 52 with the clearance 51 defined therebetween and the inner surface of the outer peripheral wall 53 extends along the outer surface of the supporting tube portion 45 of the central housing 31C, and is mounted via an unillustrated lock member. When the front holder 50 is mounted at a fixed position, the outer peripheral wall 53 functions to prevent the third seal ring 46 from coming off.

Further, the flange 59 on the rear end of the front housing 31F is softly sandwiched between the rear end of the inner peripheral wall 52 and the front surface of the rectangular tube portion 41 of the central housing 31C, whereby the front housing 31F is supported loosely movably in a radial direction in the front holder 50, i.e. supported in a floating manner.

Furthermore, the front holder 50 also functions to restrict the return of the retainer 58 from the advanced position.

Thereafter, the rear lid body 38 having the first seal ring 37 fit thereon is mounted into the rear surface opening 36 of the rear housing 30 in a water-tight manner.

Finally, the shield shell 60 is put to cover the upper, left and right and back surfaces of the housing 30 and fixed by being fastened to the upper surface of the rear housing 31R by a screw 61. In the above way, the assembling of the connector C is completed.

A usage pattern of the connector C assembled as described above is described. A front end part of the housing 30 in the connector C is fit into a mounting hole formed on a mounting portion of the case although not shown, and connected to a housing of the mating connector waiting in the case. At this time, if the housing 30 (front housing 31F) and the mating housing are misaligned, the front housing 31F is aligned while loosely moving by a floating mechanism and is connected to the mating housing. A loose movement of the front housing 31F is allowed while the flexible conductors 15 provided in the coated wires 10 are deformed, and the front housing 31F and the mating housing are precisely and smoothly connected. Associated with that, the respective terminal fittings 20 accommodated in the housing 30 are properly fit and connected to the corresponding mating terminals mounted in the mating housing. The connector C is fixed by having a front end part of the upper surface of the shield shell 60 screwed to the mounting portion of the case. In this way, conductive paths for the device in the case are formed.

If the harness pulled out of the housing 30 is subjected to vibration in a usage state, the vibration is going to be transmitted to the terminal fittings 20 via the coated wires 10, particularly via the cores 11. However, the metal sleeves 25 integrally fixed to the cores 11 in the inserting portions 17 of the coated wires 10 are embedded and fixed to the inner peripheral surfaces 35A of the wire insertion tubes 35 formed in the housing 30. Thus, the vibration transmitted along the cores 11 is blocked in parts where the metal sleeves 25 are fixed to the housing 30, the transmission of the vibration to the terminal fittings 20 is restricted and contact failures between the terminal fittings 20 and the mating terminals and the like can be prevented.

Particularly, the above part where the vibration is blocked is formed by embedding the metal sleeve 25 fixed to the core 11 in the wire insertion tube 35 of the rear housing 31R by molding. Thus, a manufacturing process is simplified and a cost reduction is realized.

Also when heat is generated in the core 11 of the coated wire 10 during use, the heat is efficiently radiated via the housing 30 since the metal sleeve 25 directly fixed to the core 11 in the inserting portion 17 is embedded in the inner peripheral surface 35A of the wire insertion tube 35 of the housing 30. Thus, a temperature increase of the core 11 of the coated wire 10 and, further, of the terminal fitting 20 can be suppressed.

Figure 2:
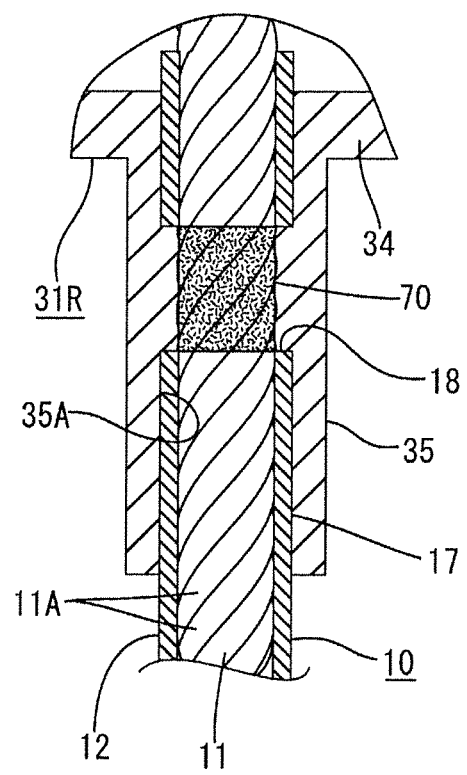
FIG. 2 is a partial section showing an embedded part of a core fixing portion according to a second embodiment.

FIG. 2 shows a second embodiment. In this second embodiment, a core fixing portion and an embedded structure thereof are changed. Specifically, a core 11 is exposed by removing an insulation coating 12 by a predetermined length at an intermediate position in a length direction of an inserting portion 17 in a coated wire 10, and a core fixing portion 70 is formed by bonding metal strands 11A constituting the core 11 by resistance welding or ultrasonic welding in that exposed part.

A rear housing 31R is formed by molding with the inserting portion 17 of the coated wire 10 inserted in a wire insertion tube 35. Here, since the core fixing portion 70 is formed by welding a twisted wire by resistance welding or ultrasonic welding, the outer peripheral surface thereof is uneven and bites into an inner peripheral surface 35A of the wire insertion tube 35, i.e. is embedded. Other structures are as in the first embodiment.

In short, the core fixing portion 70 integrated by solidifying the core 11 (metal strands 11A) in the inserting portion 17 of the coated wire 10 is fixed by biting into the inner peripheral surface 35A of the wire insertion tube 35 formed in a housing 30 in the second embodiment. Thus, as in the first embodiment, if vibration is going to be transmitted to a terminal fitting 20 via the coated wire 10, particularly via the core 11, this vibration is blocked in a part where the core fixing portion 70 is fixed to the housing 30, the transmission of the vibration to the terminal fitting 20 is restricted and a contact failure between the terminal fitting 20 and a mating terminal and the like can be prevented.

Further, also when heat is generated in the core 11 of the coated wire 10 during use, the heat is efficiently radiated via the housing 30 and a temperature increase of the core 11 of the coated wire 10 and, further, of the terminal fitting 20 can be suppressed.

As compared to the first embodiment, the second embodiment contributes to a reduction in the number of components since the metal sleeve 25 (metal member) is not used in forming the core fixing portion 70.

The technique disclosed by this specification is not limited to the above described and illustrated embodiments. For example, the following embodiments are also included.

An open metal sleeve such as a C-ring may be used as an example of the metal member constituting the core fixing portion shown in the first embodiment. With such a metal sleeve, it is sufficient to fit and crimp the metal sleeve after the insulation coating is removed to expose the core in the inserting portion of the coated wire. Thus, a fixing operation of the metal sleeve is simplified.

The assembling procedure of the connector illustrated in the above embodiments is merely an example and can be appropriately changed. Further, the shape of the housing including the number of pieces can also be appropriately changed.

The disclosed technique can be similarly applied when a braided wire is used as the flexible conductor. In light of the first embodiment, one end of the braided wire bent into an L shape is connected to the rear end of the terminal fitting, whereas the other end of the braided wire is connected to the end of the core projecting from the end of the coated wire by resistance welding or the like with a core fixing portion formed of a long and narrow metal plate laid therebetween and the coated wire is pulled out of the housing. An end part of the metal plate on a side connected to the core may be embedded in the housing by molding as a vibration blocking structure.

As another example of the metal member (core fixing portion) in the case of using the braided wire as the above flexible conductor, a barrel to be crimped to the end of the core in the coated wire may be provided on the rear end of a connection plate to be connected to an end part of the braided wire by resistance welding. In this core fixing portion, the barrel crimped to the core may be embedded in the housing by molding.

In light of the second embodiment, a core fixing portion may be formed by bonding the strands of the core projecting and exposed from the end of the coated wire at least on a base end side by resistance welding or ultrasonic welding, whereas a projecting end of the core may be connected to the end part of the L-shaped braided wire connected to the rear end of the terminal fitting, and the core fixing portion provided on a base end part of the exposed core may be embedded in the housing by molding as the vibration blocking structure.

Although the connector formed such that the wires are pulled in a right-angle direction from the rear surface of the housing is illustrated in the above embodiments, the present invention can be similarly applied to connectors formed such that wires are pulled out straight rearwardly of the housing.

Although the shield connector to be mounted on the case of an inverter or a motor is illustrated in the above embodiments, the present invention can be applied to shield connectors to be mounted on cases of devices other than inventers and motors. Further, the present invention can also be applied to non-shield connectors to be mounted on devices.

LIST OF REFERENCE SIGNS

C . . . connector
10 . . . coated wire
11 . . . core
11A . . . metal strand (strand)
12 . . . insulation coating
14 . . . long strip
15 . . . flexible conductor
17 . . . inserting portion (end part of coated wire)
18 . . . removed portion
20 . . . terminal fitting
25 . . . metal sleeve (metal member: core fixing portion)
30 . . . housing
31R . . . rear housing
35 . . . wire insertion tube (wire insertion hole)
35A . . . inner peripheral surface (of wire insertion tube 35)
70 . . . core fixing portion

The invention claimed is:

1. A connector, comprising:
a coated wire having a conductive core that is coated with an insulation coating;
a terminal fitting to be fit and connected to a mating terminal along a forward direction;
a flexible conductor interposed between the terminal fitting and an end of the coated wire; and
a housing made of synthetic resin and accommodating the terminal fitting together with the flexible conductor;
wherein:
the core of the coated wire is provided with a core fixing portion integrated with the core and the core fixing portion is embedded in the housing by molding; and
the housing includes a rear housing having the core fixing portion embedded therein and open in a rearward direction opposite to the forward direction, a central housing to be fit to the rear housing from front, and a front housing configured to accommodate the terminal fitting and to be assembled with the central housing from the front.

2. The connector of claim 1, wherein the core fixing portion is a metal member fixed to the core.

3. The connector of claim 1, wherein the core is constituted by a plurality of strands, and the core fixing portion is formed by bonding the strands by resistance welding or ultrasonic welding.

4. The connector of claim 3, wherein the housing is provided with a wire insertion hole into which an end part of the coated wire is to be inserted, and the core fixing portion is provided on the core exposed by removing the insulation coating at an intermediate position in a length direction of the end part of the coated wire and embedded in an inner surface of the wire insertion hole.

5. The connector of claim 4, wherein the flexible conductor is bent to provide an extra length of the core pulled out in an exposed state from the end of the coated wire.

6. The connector of claim 5, wherein the coated wire is pulled out in a direction intersecting with the fitting direction of the terminal fitting.

7. The connector of claim 1, wherein the housing is provided with a wire insertion hole into which an end part of the coated wire is to be inserted, and the core fixing portion is provided on the core exposed by removing the insulation coating at an intermediate position in a length direction of the end part of the coated wire and embedded in an inner surface of the wire insertion hole.

8. The connector of claim 1, wherein the flexible conductor is bent to provide an extra length of the core pulled out in an exposed state from the end of the coated wire.

9. The connector of claim 1, wherein the coated wire is pulled out in a direction intersecting with the fitting direction of the terminal fitting.

* * * * *